(12) United States Patent
Chao et al.

(10) Patent No.: US 12,471,354 B2
(45) Date of Patent: Nov. 11, 2025

(54) DIPOLE THRESHOLD VOLTAGE TUNING FOR HIGH VOLTAGE TRANSISTOR STACKS

(71) Applicant: Intel Corporation, Santa Clara, CA (US)

(72) Inventors: Robin Chao, Portland, OR (US); Bishwajeet Guha, Hillsboro, OR (US); Brian Greene, Portland, OR (US); Chung-Hsun Lin, Portland, OR (US); Curtis Tsai, Beaverton, OR (US); Orb Acton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1132 days.

(21) Appl. No.: 17/132,995

(22) Filed: Dec. 23, 2020

(65) Prior Publication Data

US 2022/0199472 A1 Jun. 23, 2022

(51) Int. Cl.
*H10D 84/03* (2025.01)
*H10D 84/01* (2025.01)
*H10D 84/83* (2025.01)
*H10D 86/00* (2025.01)
*H10D 86/01* (2025.01)

(52) U.S. Cl.
CPC ....... *H10D 84/038* (2025.01); *H10D 84/0142* (2025.01); *H10D 84/0144* (2025.01); *H10D 84/83* (2025.01); *H10D 86/01* (2025.01); *H10D 86/201* (2025.01)

(58) Field of Classification Search
CPC ....... H01L 29/40; H01L 29/41; H01L 29/423; H01L 29/42312; H01L 29/42316; H01L 29/4232; H01L 29/42384; H01L 29/42392; H01L 29/76; H01L 29/772; H01L 29/78; H01L 29/785; H01L 29/786; H01L 29/78696; H10D 84/0128; H10D 84/0181; H10D 84/0193; H10D 84/856; H10D 84/853; H10D 64/01; H10D 64/685; H10D 64/691; H10D 64/68; H10D 62/364; H10D 62/121; H10D 30/014; H10D 30/43;
(Continued)

(56) References Cited

U.S. PATENT DOCUMENTS 10,825,736 B1 11/2020 Zhang et al.
2005/0214998 A1 9/2005 Chen et al.
(Continued)

OTHER PUBLICATIONS

Bao, R., et al., "Multiple-Vt Solutions in Nanosheet Technology for High Performance and Low Power Applications", 2019 IEEE International Electron Devices Meeting (IEDM), 4 pgs.
(Continued)

*Primary Examiner* — Julio J Maldonado
*Assistant Examiner* — Stanetta D Isaac
(74) *Attorney, Agent, or Firm* — Essential Patents Group, LLP

(57) ABSTRACT

Integrated circuitry comprising high voltage (HV) and low voltage (LV) ribbon or wire (RoW) transistor stack structures. In some examples, a gate electrode of the HV and LV transistor stack structures may include the same work function metal. A metal oxide may be deposited around one or more channels of the HV transistor stack, thereby altering the dipole properties of the gate insulator stack from those of the LV transistor stack structure.

20 Claims, 9 Drawing Sheets

(58) Field of Classification Search
CPC .......... H10D 30/6735; H10D 30/6757; H10D 30/024; H10D 30/62; H10D 86/201; B82Y 10/00

See application file for complete search history.

(56) References Cited

U.S. PATENT DOCUMENTS

| | | |
|---|---|---|
| 2007/0045713 A1 | 3/2007 | Ono et al. |
| 2008/0102607 A1 | 5/2008 | Passlack et al. |
| 2012/0139062 A1 | 6/2012 | Yuan et al. |
| 2013/0062704 A1 | 3/2013 | Cheng et al. |
| 2013/0181277 A1 | 7/2013 | Wu et al. |
| 2013/0256805 A1 | 10/2013 | Chuang et al. |
| 2016/0049491 A1 | 2/2016 | Lin et al. |
| 2017/0053915 A1 | 2/2017 | Ando et al. |
| 2017/0053930 A1 | 2/2017 | Prinz et al. |
| 2017/0092723 A1 | 3/2017 | Ando et al. |
| 2019/0088798 A1* | 3/2019 | Kim .................. B82Y 10/00 |
| 2020/0194569 A1 | 6/2020 | Wang et al. |
| 2020/0219979 A1* | 7/2020 | Rachmady ...... H01L 21/823814 |
| 2020/0258785 A1* | 8/2020 | Zhang ............. H01L 21/823462 |
| 2020/0373300 A1 | 11/2020 | Zhang et al. |
| 2021/0066137 A1* | 3/2021 | Hsu .................. H01L 21/28185 |
| 2021/0210388 A1 | 7/2021 | Zhang et al. |
| 2021/0305400 A1 | 9/2021 | Hsu et al. |
| 2021/0366783 A1 | 11/2021 | Chu et al. |
| 2021/0391439 A1 | 12/2021 | Pao et al. |
| 2022/0199472 A1 | 6/2022 | Chao et al. |
| 2022/0199620 A1 | 6/2022 | Thomas et al. |
| 2022/0199796 A1 | 6/2022 | Zhang et al. |
| 2023/0209799 A1 | 6/2023 | Ong et al. |

OTHER PUBLICATIONS

Bao, R., et al., "Selective Enablement of Dual Dipoles for Near Bandedge Multi-Vt Solution in High Performance in FinFET and Nanosheet Technologies", 2020 Symposium on VLSI Technology Digest of Technical Papers, 2 pgs.

Extended European Search Report from European Patent Application No. 21197074.4 notified Feb. 22, 2022, 15 pgs.

Non-Published, U.S. Appl. No. 17/127,280, filed Dec. 18, 2020.

Non-Published, U.S. Appl. No. 17/132,995, filed Dec. 23, 2020.

Chung, Wonil, et al., "Integration of ALD high-k dipole layers into CMOS SOI nanowire FETs for bi-directional threshold voltage engineering", 2020 IEEE Silicon Nanoelectronics Workshop, 2 pgs.

* cited by examiner

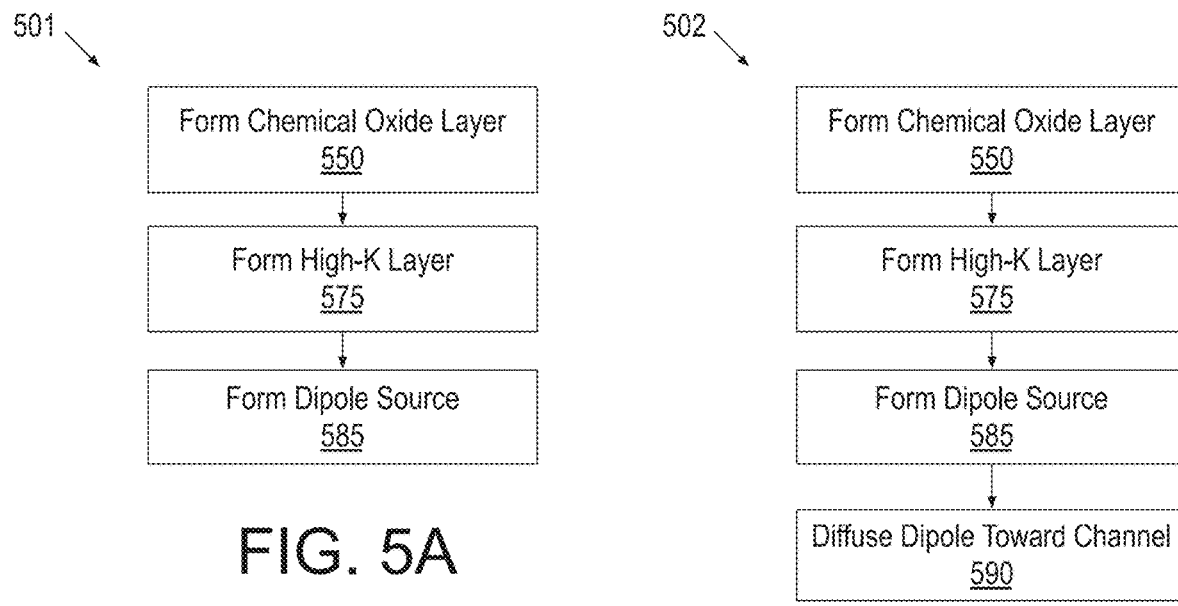
FIG. 5A
FIG. 5B
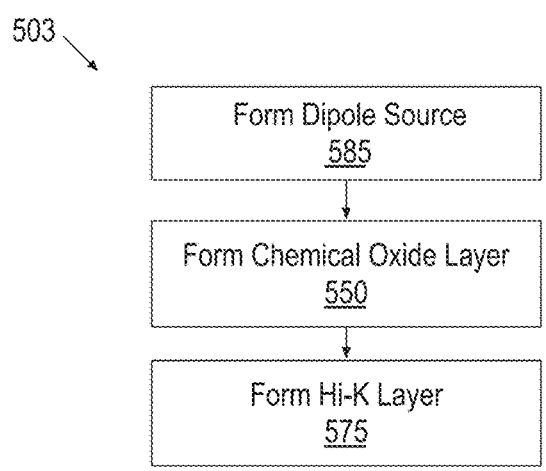
FIG. 5C

DIPOLE THRESHOLD VOLTAGE TUNING FOR HIGH VOLTAGE TRANSISTOR STACKS

BACKGROUND

Demand for higher performance integrated circuits (ICs) in electronic device applications has motivated increasingly dense transistor architectures. Stacked gate-all-around (GAA) transistor structures, such as ribbon or wire (RoW) structures, include a plurality of channel regions that are in a vertical stack with one transistor channel over another.

For any transistor architecture, it is advantageous to be able to set the transistor threshold voltage ($V_t$). According to convention, $V_t$ tuning may be accomplished by depositing a particular work function metal as part of a gate electrode, or by varying the thickness of the work function metal, for example. If multiple threshold voltages are desired in an IC, the IC fabrication process must then accommodate multiple work function metals and/or metal layer thicknesses.

In stacked high voltage (HV) transistor architectures designed for operating voltages exceeding 1.0 V $V_{ds}$, thicker gate dielectric within the small spaces between stacked channel regions constrains the thickness of a work function metal more severely than low voltage (LV) logic transistor architectures typically rated for operation at less than 0.9V. If a gate electrode's work function metal has insufficient thickness to strongly set $V_t$, HV devices will be the first to hit a scaling limit associated with an inability to control transistor $V_t$ unless alternative fabrication techniques and transistor stack architectures can be found.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 5A, 5B, and 5C are flow diagrams illustrating methods of forming one or more $V_t$ shifting dipoles in HV transistor stack structures, in accordance with some embodiments;

DETAILED DESCRIPTION

Figure 1:
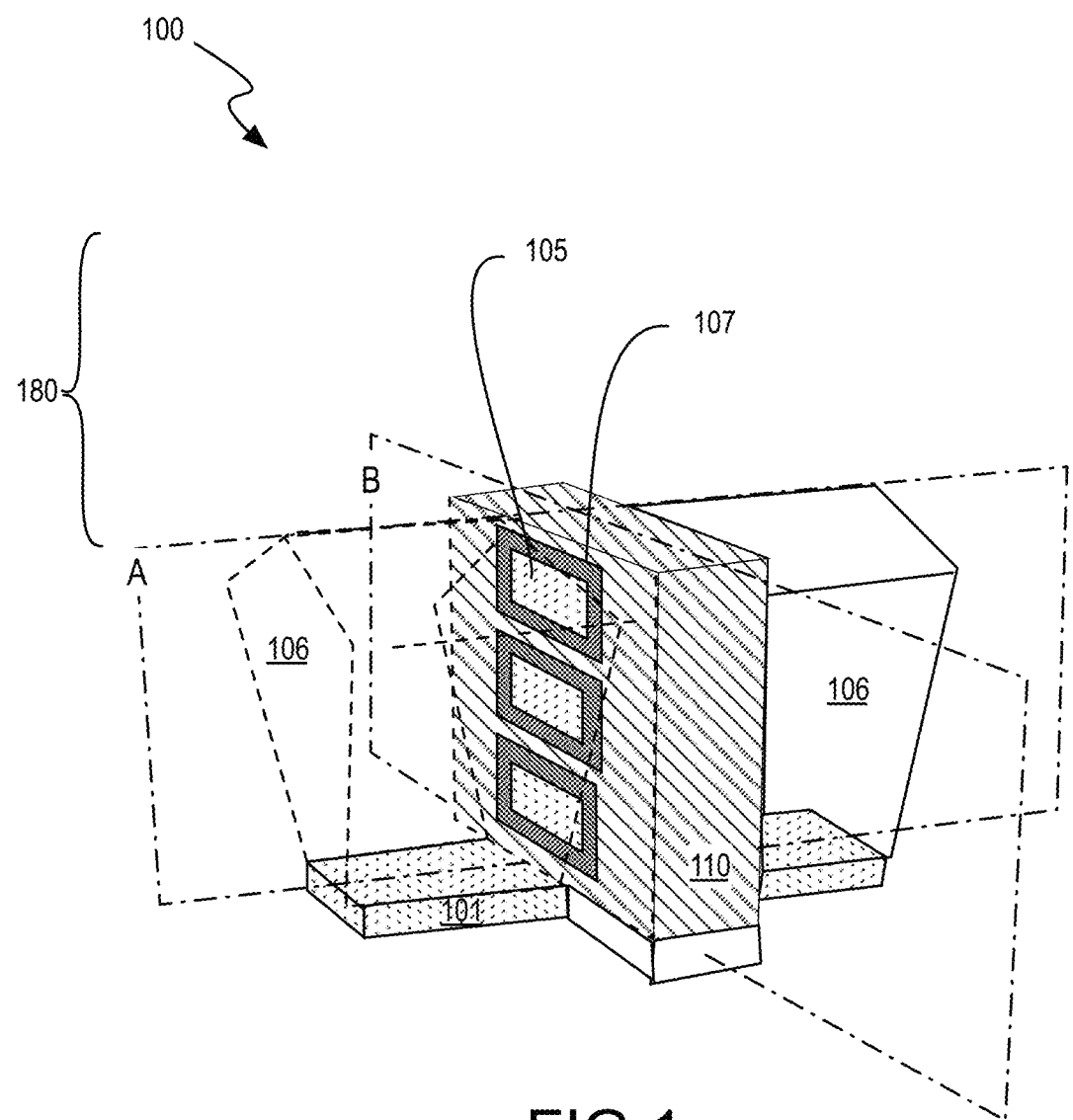
FIG. 1 illustrates an isometric sectional view of a HV transistor stack structure including at least one $V_t$ shifting dipole, in accordance with some embodiments.
Figure 1:
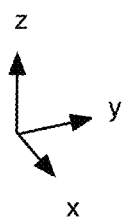

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, a metal oxide may be formed around one or more channels of a transistor stack as a solid-state source of a dipole species that can alter the $V_t$ of the transistor stack. The metallic oxide functioning as the $V_t$ shifting dipole material is of a composition distinct from any other included within the gate insulator stack, for example as a high-K gate material layer. The dipole species may be deposited, or diffused within the gate insulator stack, to be in close proximity to the channel material, thereby altering the dipole properties of the gate insulator stack. Different transistor stack structures (e.g., HV vs. LV) may be exposed to differing amounts or types of the metal dipole species to provide a range of $V_t$ across the devices. In some exemplary embodiments, a gate insulator stack of a HV transistor includes the $V_t$ shifting dipole material. In further embodiments, a gate insulator stack of a LV transistor lacks the $V_t$ shifting dipole material. Threshold voltage for HV and LV transistors may therefore be differentiated, at least in part, by the metallic dipole species. In the presence of the $V_t$ shifting dipole material, a gate insulator material of greater thickness in the HV transistor, which necessitates a reduction in workfunction metal thickness relative to a LV transistor, will retain better $V_t$ control.

FIG. 1 illustrates an isometric sectional view of a HV transistor stack structure 100 including $V_t$ shifting dipoles, in accordance with some embodiments. HV transistor stack structure 100 has a GAA transistor architecture with a plurality of stacked channel regions 105. HV transistor stack structure 100 is illustrated as including three active channel regions 105, but a HV transistor stack structure may include any integer number of channel regions (e.g., 2, 3, 4, 5 . . . 10 . . . 20, etc.) as embodiments herein are not limited in this respect.

HV transistor stack structure 100 may comprises transistors of either positive or negative conductivity type such that channel regions 105 may each be portions of either a P-type or N-type transistor. Source and drain regions 106 are coupled together through channel regions 105. In the illustrated embodiment, each of channel regions 105 are operable to contribute to a total drive current of HV transistor stack structure 100. In HV transistor stack structure 100 the plurality of channel regions 105 are operative in electrical parallel between source and drain regions 106. However, a HV transistor stack may instead comprise a plurality transistors that are operative independent of each other. For example, a first transistor may include a first of channel regions 105 and a second transistor may include a second of channel regions 105, etc. For such embodiments, each electrically independent transistor within a transistor stack structure may include any integer number of channel regions (e.g., 1, 2 . . . 5 . . . 10, etc.) with a matching number of source and drain regions 106 that are electrically isolated from other source and drain regions 106.

As described further below, a $V_t$ shifting dipole material comprises a rare earth metal and may be introduced into a gate insulator stack 107 so as to surround at least one of channel regions 105 and thereby alter the transistor threshold voltage from a reference threshold the transistor would otherwise have in absence of the $V_t$ shifting dipole material. In some embodiments, for example, a P-type $V_t$ shifting dipole is present around channel regions 105 coupled to P-type material of source and drain regions 106. In some other embodiments, an N-type $V_t$ shifting dipole is present around channel regions 105 that are coupled to N-type material of source and drain regions 106. For either of these embodiments, the threshold voltage may be a function of both a work function metal within gate electrode 110 and the $V_t$ shifting dipole material within gate insulator stack 107. Other transistor stack structures (not depicted), may lack such a $V_t$ shifting dipole material and the threshold voltage would then be primarily a function of the work function metal. As described further below, because the $V_t$ shifting dipole material requires very little volume within a gate insulator stack, its introduction is particular advantageous where the gate electrode thickness is reduced in a HV transistor stack structure to accommodate a greater thickness of gate insulator material needed to sustain higher operating voltages.

As further illustrated in FIG. 1, channel regions 105 may be over a sub-channel material, which may have been part of a workpiece substrate 100, such as a large format semi-conductor wafer, for example. An integrated circuit including HV transistor stack structure 100 may include any number of metallization levels 180 over a "top" or "front" side of transistor structure 100, for example.

In FIG. 1, two orthogonal planes A and B are demarked by dashed line. Plane A is a "gate-cut" plane that passes through a transverse width of gate electrode 110 and passes through a longitudinal length of channel regions 105. Plane B is a "fin-cut" plane that passes through a transverse width of channel regions 105 and passes through a longitudinal length of gate electrode 110. In the illustrated example, source and drain regions 106 comprise faceted epitaxial material that has been grown, for example laterally from an end portion of channel regions 105, and/or from source/drain RoW ends (not depicted) cantilevered from channel regions 105. Source and drain 106 need not be epitaxial material, in which case the facets shown in FIG. 1 may not be present. Source and drain regions 106 also need not be merged into a unitary body, in which case cantilevered source/drain nanowire ends may be individually contacted by a terminal contact metal. Although not depicted for the sake of clarity, metallization levels 180 may include a source and/or drain contact that is in physical contact with source and drain regions 106. Likewise, front-side metallization levels 180 may further include a gate contact (not depicted) to gate electrode 110.

Figure 2A:
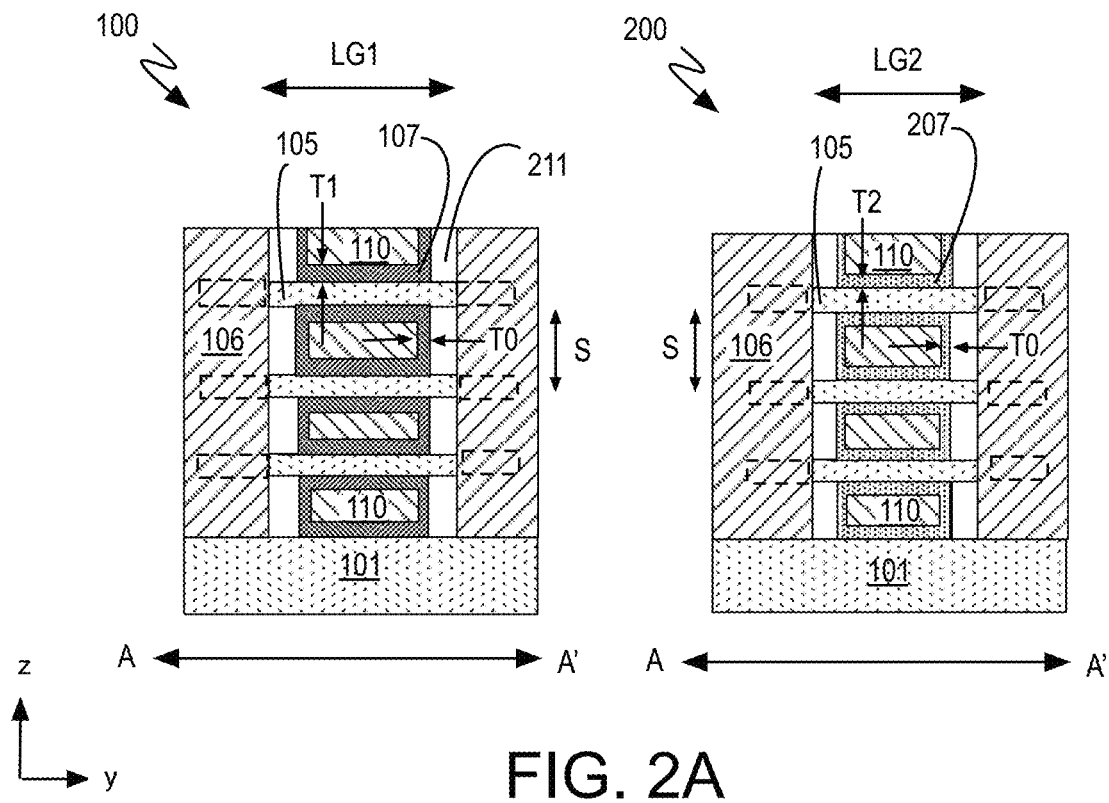
FIG. 2A illustrates a first cross-sectional view of the HV transistor stack structure introduced in FIG. 1 and an adjacent LV transistor stack structure, in accordance with some embodiments.
Figure 2B:
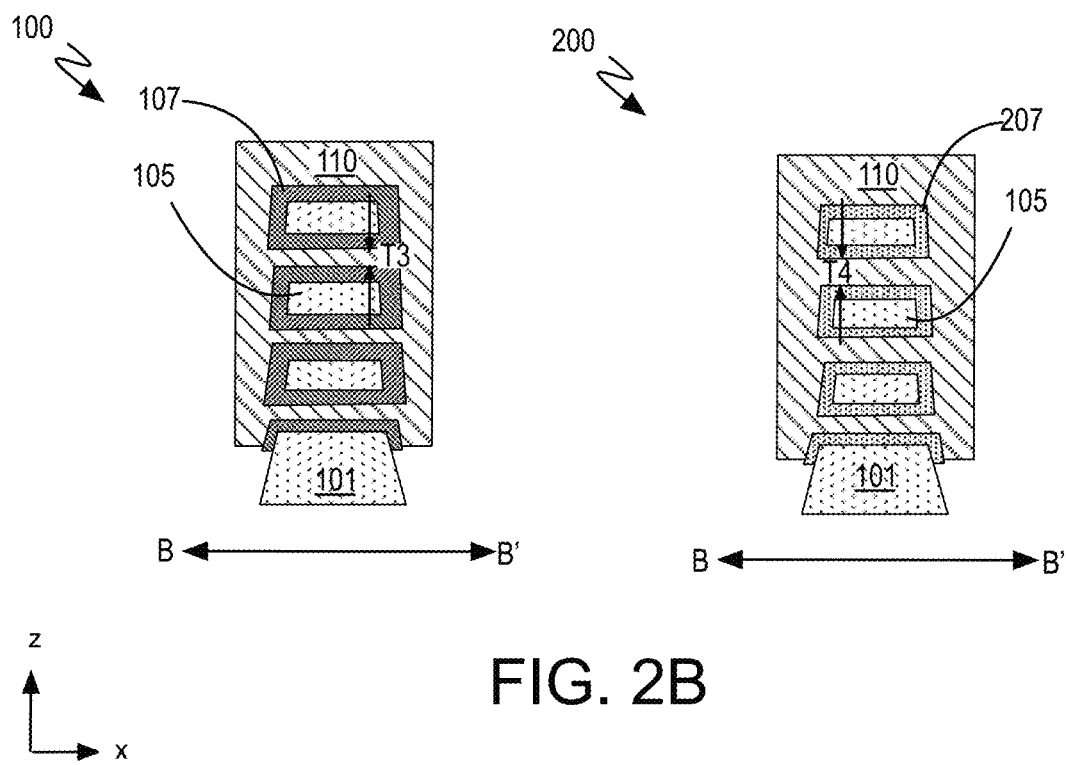
FIG. 2B illustrates a second cross-sectional view of the HV transistor stack structure introduced in FIG. 1 and an adjacent LV transistor stack structure, in accordance with some embodiments.

FIG. 2A illustrates a cross-sectional view of HV transistor stack structure 100 along the A-A' plane introduced in FIG. 1, in accordance with some embodiments. FIG. 2B illustrates a second cross-sectional view of HV transistor stack structure 100 along the B-B' plane introduced in FIG. 1, in accordance with some embodiments. FIGS. 2A and 2B further illustrate a LV transistor stack structure 200 along the same two cross-sectional planes. In the exemplary embodiments, LV transistor stack structure 200 includes a gate insulator stack 207, which lacks the $V_t$ shifting dipole material present in gate insulator stack 107.

As shown for HV stack structure 100, channel regions 105 have a first longitudinal gate (channel) length LG1 between source and drain regions 106 suitable for sustaining higher operating voltages (e.g., $V_{ds}$) Channel regions 105 may extend through a dielectric spacer 211, as illustrated. As shown for LV stack structure 200, channel regions 105 have a shorter longitudinal gate (channel) length LG2 suitable for sustaining lower operating voltages (e.g., $V_{ds}$).

For both HV and LV transistor stack structures 100, 200 channel regions 105 are bodies of semiconductor material that may have been patterned from a fin of a substrate material layer, for example. As shown in FIG. 2A, channel regions 105 are spaced apart by a vertical spacing S that is substantially the same in both HV and LV transistor stack structures 100 and 200. The trapezoidal profiles of channel regions 105 illustrated in FIG. 2B are representative of structural asymmetry associated with front-side transistor fabrication. Such asymmetry may be a result of feature sidewall slopes that evolve during subtractive patterning of a semiconductor fin, for example. Although channel regions 105 are illustrated in FIG. 2B as nanoribbons having a transverse width greater than their vertical thickness, channel regions 105 may instead be nanowires of substantially equal vertical thickness and lateral width, or nanoribbons having a transverse width less than their vertical thickness.

In some embodiments, channel regions 105 are crystalline semiconductor. Although the crystalline semiconductor includes polycrystalline thin film material, the crystalline semiconductor may be advantageously monocrystalline. In some such embodiments, the crystallinity of channel regions 105 is cubic with the top surfaces having crystallographic orientation of (100), (111), or (110), for example. Other crystallographic orientations are also possible. In some embodiments, channel regions 105 are a substantially monocrystalline group IV semiconductor material, such as, but not limited to substantially pure silicon (e.g., having only trace impurities), silicon alloys (e.g., SiGe), or substantially pure germanium (e.g., having only trace impurities). Channel regions 105 may also have any of these same exemplary compositions in alternative polycrystalline or amorphous embodiments, for example where HV transistor stack structure 100 and LV transistor stack structure 200 has been fabricated from a thin film semiconductor material layer. Polycrystalline or amorphous embodiments of channel regions 105 may also include semiconducting metal oxides, such as IGZO. Although channel regions 105 are illustrated as having a substantially homogenous composition, they may alternatively comprise one or more semiconductor heterojunctions that, for example further include a first semiconductor material adjacent to a second semiconductor material.

Source/drain regions 106 may similarly comprise any semiconductor material suitable for a transistor. In some embodiments, source/drain semiconductor regions 106 include impurity-doped portions of semiconductor material protruding laterally beyond channel regions 105 as denoted by dashed lines in FIG. 2A. In the illustrated embodiment, source/drain regions 106 include a unified epitaxial semiconductor source/drain structure. Source/drain regions 106 may be comprise one or more electrically active impurities. In some embodiments, for example, source/drain regions 106 are a Group IV semiconductor material (e.g., Si, Ge, or SiGe alloy) with at least one of a p-type impurity (e.g., boron or gallium) or an n-type impurity (e.g., phosphorus, arsenic, or antimony). In an exemplary IC, both HV transistor stack structure 100 and LV transistor stack 200 includes N-type semiconductor material in source/drain regions 106. Although not illustrated, comparable P-type HV and LV transistors may also be included within an IC.

As further illustrated in FIG. 2A and FIG. 2B, sub-channel material 101 is under the stack of channel regions 105, and under gate electrode 110. Sub-channel material 101 may be a base of a fin, for example, from which channel regions 105 were formed. As such, sub-channel material 101 may have a composition and/or microstructure similar to channel regions 105. For example, in some embodiments where channel regions 105 are of a Group IV material (e.g., silicon), sub-channel material 101 is also a Group IV material (e.g., silicon). In some further embodiments where channel regions 105 are substantially monocrystalline, sub-channel material 101 is also substantially monocrystalline, and has the same crystallinity and/or crystal orientation as that of channel regions 105. In alternative embodiments, sub-channel material 101 is a buried insulator layer (e.g., $SiO_2$), for example of a semiconductor-on-insulator (SOI) substrate.

As further shown in FIG. 2A and FIG. 2B, HV transistor stack structure 100 includes a gate stack comprising gate electrode 110 and gate insulator stack 107 cladding channel regions 105 to provide gate-all-around control of channel conductivity. In the illustrated embodiment, LV transistor stack structure 200 also includes gate electrode 110, but a different gate insulator stack 207 clads channel regions 105.

For the illustrated embodiments, gate electrode 110 is depicted as a single homogeneous metal. In some embodiments, gate electrode 110 for both stack structures 100 and 200 includes the same n-type work function metal, which may have a work function between about 3.9 eV and about 4.2 eV, for example. Suitable n-type work function metals include, but are not limited to, hafnium, zirconium, titanium, tantalum, aluminum, and metal carbides that include these elements (e.g., titanium carbide, zirconium carbide, tantalum carbide, hafnium carbide and aluminum carbide). In some other embodiments, gate electrode 110 for both stack structures 100 and 200 includes the same p-type work function metal, which may have a work function between about 4.9 eV and about 5.2 eV, for example. Suitable p-type materials include, but are not limited to, ruthenium, palladium, platinum, cobalt, nickel titanium, tungsten, conductive metal nitrides (e.g., TiN, WN), and conductive metal oxides (e.g., ruthenium oxide). In still other embodiments, gate electrode 110 for both stack structures 100 and 200 may instead include only a mid-gap work function metal having a work function between those of the n-type and p-type work function metals (e.g., 4.2-4.9 eV). Although not illustrated in FIG. 2A, or 2B, a compositionally distinct gate fill metal may be over the work function metal where a thickness of the work function metal does not fully occupy the volume allocated to gate electrode 110.

In alternative embodiments, HV and LV transistor stack structures 100 and 200 may instead have different gate electrodes, for example with different work function metals. Although embodiments with a single work function metal for both HV and LV transistor stack structures 100 and 200 may be advantageous for greater ease of manufacture, HV and LV transistor may instead have distinct gate electrodes comprising different work function metals. For example, a HV transistor stack structure may comprise any one of the n-type or p-type work function metals described above in combination with a LV transistor stack structure that includes any other of the n-type or p-type work function metals.

As further illustrated in FIGS. 2A and 2B, gate insulator stack 107 completely surrounds channel regions 105 within HV transistor stack structure 100. Gate insulator stack 107 has thickness T1 between channel regions 105 and gate electrode 110. Although gate insulator stack thickness T1 may vary with technology generation, in some exemplary embodiments where HV transistor stack structure 100 is operable at voltages over 1V (e.g., 1.2V-1.5V; $V_{gs}$ or $V_{ds}$) gate insulator stack thickness T1 is at least 3 nm (e.g., 3.0-4.0 nm). In contrast, gate insulator stack 207 has a thickness T2 between channel regions 105 and gate electrode 110. Thickness T2 is significantly less than thickness T1.

Notably, in the illustrated example both thickness T2 and T1 are greater than a deposited insulator material thickness T0, which is present between sidewalls of gate electrode 110 and spacer 211. The difference in thickness between T1 and T0 is attributable to a thermal (chemical) oxide that is present only on surfaces of channel regions 105. Hence, gate insulator stack 107 is a stack of both a chemical oxide layer and a high-k insulator layer, but the full stack is present only over surfaces of channel regions 105 because the chemical oxide is selectively formed on only channel regions 105. The difference in thickness between T2 and T0 is similarly attributable to a thermal (chemical) oxide that is present only on surfaces of channel regions 105. Hence, gate insulator stack 207 is a stack of both the chemical oxide layer and a high-k insulator layer, but the full stack is present only over surfaces of channel regions 105 because the chemical oxide is selectively formed on only channel regions 105. Any difference between gate insulator thicknesses T1 and T2 for such embodiments is therefore attributable to the sum of the difference in thickness of the chemical oxide layer and the difference in thickness of deposited insulator layer between HV and LV transistors. In the illustrated embodiment, since high-k thickness T0 is the same for both HV transistor 100 and LV transistor 200, the difference in gate insulator thicknesses T1 and T2 is exclusively attributable to a difference in chemical oxide layer thickness.

For embodiments including a selective chemical oxide layer, the portion of the difference between gate insulator thicknesses T1 and T2 attributable to only the chemical oxide layer may be deduced by comparing the deposited insulator layer thickness of a HV and LV transistor, and subtracting that difference from the difference between gate insulator thicknesses T1 and T2.

Although gate insulator stack thickness T2 may also vary with technology generation, in some exemplary embodiments where LV transistor stack structure 200 is operable at voltages under 1V (e.g., 0.6 V-0.8V) gate insulator stack thickness T2 is less than 3 nm (e.g., 1.5-3.0 nm). Hence, as illustrated in FIG. 2A-2B, gate insulator stack 107 occupies more of channel region spacing S than does gate insulator stack 207 so that gate electrode 110 of HV transistor stack structure 100 has a thickness T3 within spacing S that is less than gate electrode thickness T4 within space S of LV transistor stack structure 200. Although gate electrode thicknesses T3 and T4 may vary, in some embodiments, thickness T3 is insufficient to adequately set $V_t$ of HV transistor stack structure 100.

In accordance with some exemplary embodiments, both of gate insulator stacks 107 and 207 include a high-k material layer that has a bulk relative permittivity greater than 8. This high-k material layer may advantageously have substantially the same chemical composition for both gate insulator stacks 107 and 207. As noted above, both of gate insulator stacks 107, 207 may also include a chemical oxide layer. In some embodiments where channel regions 105 are substantially pure silicon, the chemical oxide layer comprises predominantly silicon and oxygen. As also noted above, this chemical oxide layer may only present over surfaces of channel regions 105. It should be noted however, that if one replaced the selective formation of chemical oxide with a non-selective deposition process, the composition of the gate insulator stacks 107 and 207 would not as significantly depend on the composition of the surface(s) with which they contact.

While both gate insulator stacks 107 and 207 may include the same high-k material layer, the two gate insulator stacks differ compositionally at least in the amount of a $V_t$ shifting dipole present somewhere within the gate insulator stacks 107 and/or 207. In exemplary embodiments, the $V_t$ shifting dipole is an oxide of a rare earth metal that is distinct from any other metal present in the high-k material layer included in both gate insulator stacks 107 and 207. The chemical compositions of gate insulator stacks 107 and 207 shown in FIGS. 2A and 2B are therefore different by at least the amount (concentration) of this dipole metal.

In exemplary embodiments, gate insulator stack 107 includes a dipole metal that is completely absent from gate insulator stack 207. In other embodiments, a dipole metal may be present in both gate insulator stacks 107 and 207, but the amount of this dipole metal varies between gate insulator stack 107 and 207. In one example, there is more of the dipole metal present within gate insulator stack 107 than in gate insulator stack 207. The variation in the amount of dipole metal between gate insulator stacks 107 and 207 may induce a variation in $V_t$ sufficient to enable HV and LV transistor stack structures 100, 200 to include a single gate electrode 110 with a single work function metal. The variation in the amount of dipole metal between gate insulator stacks 107 and 207 may induce a variation in $V_t$ sufficient to accommodate the reduced gate electrode thickness T3. Variation in $V_t$ attributable to the variation in the amount of dipole metal between gate insulator stacks 107 and 207 may augment any variation in $V_t$ attributable to other distinctions between HV transistor stack structure 100 and LV transistor stack structure 200, such as different work function metal thicknesses or compositions.

Figure 3A:
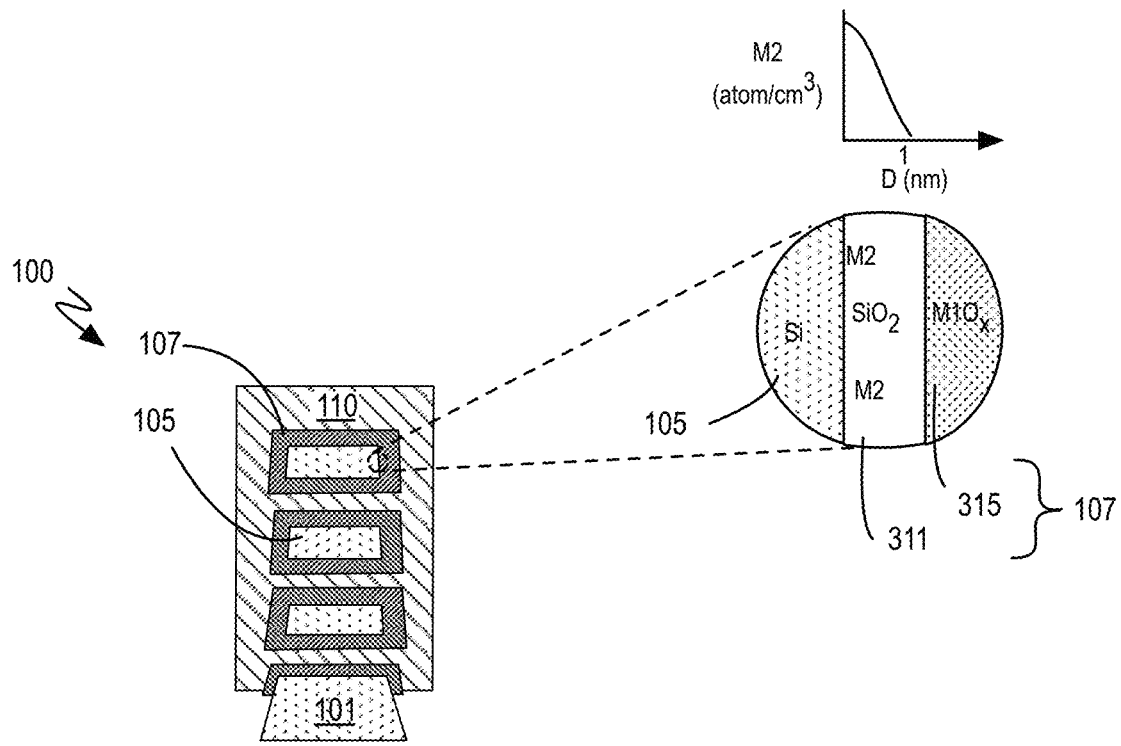
FIGS. 3A and 3B illustrates expanded cross-sectional views of the HV and LV transistor stack structures illustrated in FIGS. 2A and 2B, in accordance with some embodiments.

FIG. 3A illustrates an expanded cross-sectional view of HV transistor stack structure 100, in accordance with some embodiments. As shown, gate insulator stack 107 includes a high-k material layer 315 surrounding chemical oxide layer 311 that is in direct contact with channel region 105. For exemplary embodiments where channel region 105 comprises silicon (e.g., pure Si or an alloy), chemical oxide layer 311 includes both Si and oxygen (e.g., $SiO_2$) and may have any thickness, but is advantageously greater than 1.0 nm and may be as much as 1.5-2.0 nm. Elements other than silicon may be present within chemical oxide layer 311. For example, hydrogen and/or carbon impurities may be present within chemical oxide layer 311, but only at trace levels such that chemical oxide layer 311 is predominantly silicon and oxygen.

In the illustrated example, high-k material layer 315 is in direct contact with chemical oxide layer 311, and may have any composition known to be suitable as a transistor gate dielectric and that has a bulk relative permittivity greater than 8. One exemplary high-k material is metal oxide ($M1O_x$). Examples include a metal oxide comprising predominantly aluminum (e.g., $AlO_x$), a metal oxide comprising predominantly magnesium (e.g., MgO), a metal oxide comprising predominantly lanthanum (e.g., $LaO_x$), a metal oxide comprising predominantly hafnium (e.g., $HfO_x$), or metal oxide comprising predominantly zirconium (e.g., $ZrO_x$). In other examples, high-k material layer 315 is an alloyed metal oxide comprising significant portions of two or more metals (e.g., $HfAlO_x$, $HfZrO_x$). In some further embodiments, high-k material layer 315 further includes silicon. For example, metal silicates, such as, but not limited to $HfSiO_x$, or $ZrSiO_x$, may also be suitable a high-k gate insulator layer for some channel compositions (e.g., Si, Ge, SiGe, III-V). Some specific examples of other suitable high-k gate dielectric materials include lanthanum aluminum oxide, tantalum silicon oxide, tantalum oxide, titanium oxide, barium strontium titanium oxide, barium titanium oxide, strontium titanium oxide, yttrium oxide, lead scandium tantalum oxide, and lead zinc niobate. Although the thickness of high-k material layer 315 may vary, in some exemplary embodiments it is no more than 2.0 nm (e.g., 1.0-2.0 nm).

Figure 3B:
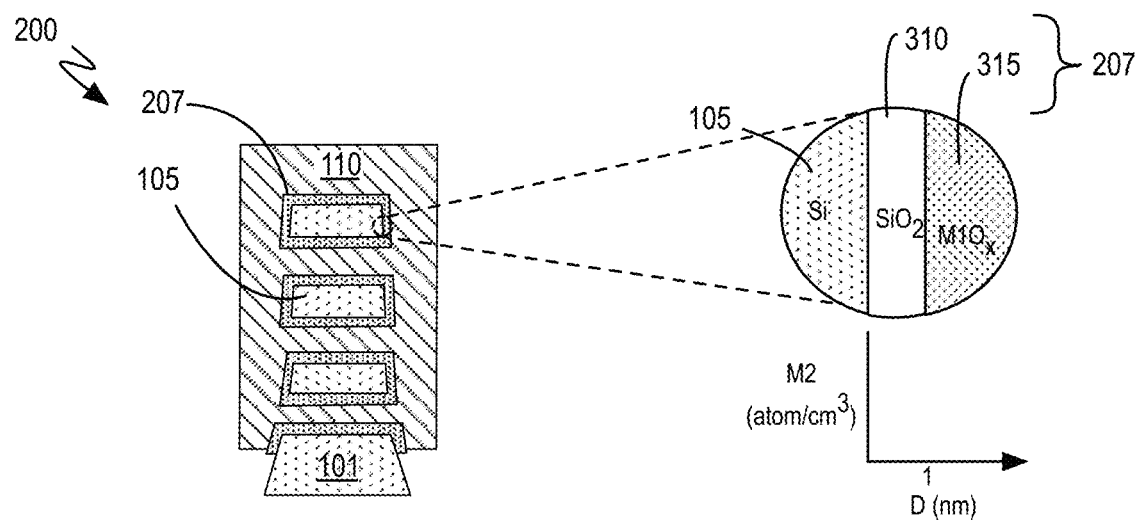

As further illustrated in FIG. 3B, gate insulator stack 207 includes chemical oxide layer 310 in contact with channel region 105, and high-k gate material layer 315 in contact with chemical oxide layer 310. As noted above, high-k gate material layer 315 may be substantially the same for both gate insulator stacks 107 and 207, for example both including metal oxide $M1O_x$. Gate insulator stack 207 differs from gate insulator stack 107 in the amount of a $V_t$ shifting dipole that comprising dipole metal M2. In the example shown, dipole metal M2 is present within gate insulator stack 107, but substantially absent from gate insulator stack 207. In other embodiments, dipole metal M2 is present within both gate insulator stacks 107 and 207, but the amount (concentration) of dipole metal M2 is less in one or the other (e.g., less in gate insulator stack 207 than in gate insulator stack 107).

In the specific example illustrated, dipole metal M2 is present within chemical oxide layer 311 and is therefore in very close proximity (e.g., with 1.0 nm) of channel region 105, which may be advantageous for strongly affecting transistor $V_t$. However, dipole metal M2 is substantially absent from chemical oxide layer 310. With the amount of dipole metal M2 varying between the two chemical oxide layers 310 and 311, the two chemical oxide layers are compositionally different between HV and LV transistor stack structures 100 and 200.

As shown in the qualitative line graph in FIG. 3A, the concentration of dipole metal M2 within gate insulator stack 107 increases toward channel region 105 with metal M2 becoming undetectable within gate insulator stack 107 beyond about 1.0 nm from channel region 105. Hence, in this example where chemical oxide layer 311 is 1.0 nm, dipole metal M2 is substantially absent from high-k material layer 315. However, in other embodiments metal M2 may also be present within high-k material layer 315 in addition to, or instead of, being present within chemical oxide layer 311. In some embodiments where metal M2 is present within high-k material layer 315, the concentration of metal M2 within high-k material layer 315 is less than the concentration of high-k metal M1. Hence, high-k material layer 315 may still be considered primarily $M1O_x$ with some metal M2 present as a dipole dopant. In other embodiments, dipole metal M2 may also be present at detectable levels only within high-k material layer 315, or only within a second high-k material layer that clads high-k material layer 315 (not depicted). The $V_t$ shifting dipole comprising metal M2 may be introduced into chemical oxide layer 311 and/or high-k material layer 315 from a solid state dopant source material so that the precise location of dipole metal M2 within gate insulator stack 107 may vary as a function of when the dipole dopant source material is deposited relative to the deposition of the other dielectric material layers included in the stack.

Dipole metal M2 may be present within gate insulator stack 107, as non-ionic oxide (e.g., $M2O_x$) or as an ionic oxide. Exemplary ionic oxides may further comprise silicon (e.g., as a silicate) when M2 is within chemical oxide layer 311, or may further comprise metal M1 (e.g., as a hafnate) when M2 is within high-k material layer 315 (e.g., $HfO_x$). Metal M2 may be any metal that forms a stable dipole compound, including metals known to be suitable as high-k dielectric materials as well as metals that form compounds having somewhat lower dielectric constants. For example, any of the metals listed above as suitable choices for gate dielectric material layer 315 may also be suitable as metal M2. Metal M2 may be selected based on dipole properties of compounds it forms within chemical oxide layer 311 (and/or high-k material layer 315) to achieve a particular transistor threshold voltage modulation for a given transistor conductivity type.

In some PMOS embodiments, metal M2 is Al (e.g., forming a dipole as $AlO_x$, $AlSiO_x$, or $AlHfO_x$, etc.), Ga (e.g., forming a dipole species $GaO_x$, $GaSiO_x$, or $GaHfO_x$, etc.), Mo (e.g., forming a dipole species $MoO_x$, $MoSiO_x$, or $MoHfO_x$, etc.), or Co (e.g., forming a dipole species $CoO_x$, $CoSiO_x$, or $CoHfO_x$, etc.), or Ni (e.g., forming a dipole species $NiO_x$, $NiSiO_x$, or $NiHfO_x$, etc.), or Nb (e.g., forming a dipole species $NbO_x$, $NbSiO_x$, or $NbHfO_x$, etc.). In some NMOS embodiments, metal M2 is Mg (e.g., forming a dipole species s $MgO_x$, $MgSiO_x$, or $MgHfO_x$, etc.), Ca (e.g., forming a dipole species $CaO_x$, $CaSiO_x$, or $CaHfO_x$, etc.), Sr (e.g., forming a dipole species $SrO_x$, $SrSiO_x$, or $SrHfO_x$, etc.), Ba (e.g., forming a dipole species $BaO_x$ or $BaSiO_x$, $BaHfO_x$, etc.), La (e.g., forming a dipole species $LaO_x$, $LaSiO_x$, or $LaHfO_x$, etc.), Sc (e.g., forming a dipole species $ScO_x$, $ScSiO_x$, or $ScHfO_x$, etc.), or Y (e.g., forming a dipole species $YO_x$, or $YSiO_x$, $YHfO_x$, etc.), or Gd (e.g., forming a dipole species $GdO_x$, or $GdSiO_x$, $GdHfO_x$, etc.), or Er (e.g., forming a dipole species $ErO_x$, or $ErSiO_x$, $ErHfO_x$, etc.), or Yb (e.g., forming a dipole species $YbO_x$, or $YbSiO_x$, $YbHfO_x$, etc.), or Lu (e.g., forming a dipole species $LuO_x$, or $Lu,SiO_x$, $LuHfO_x$, etc.).

Figure 4:
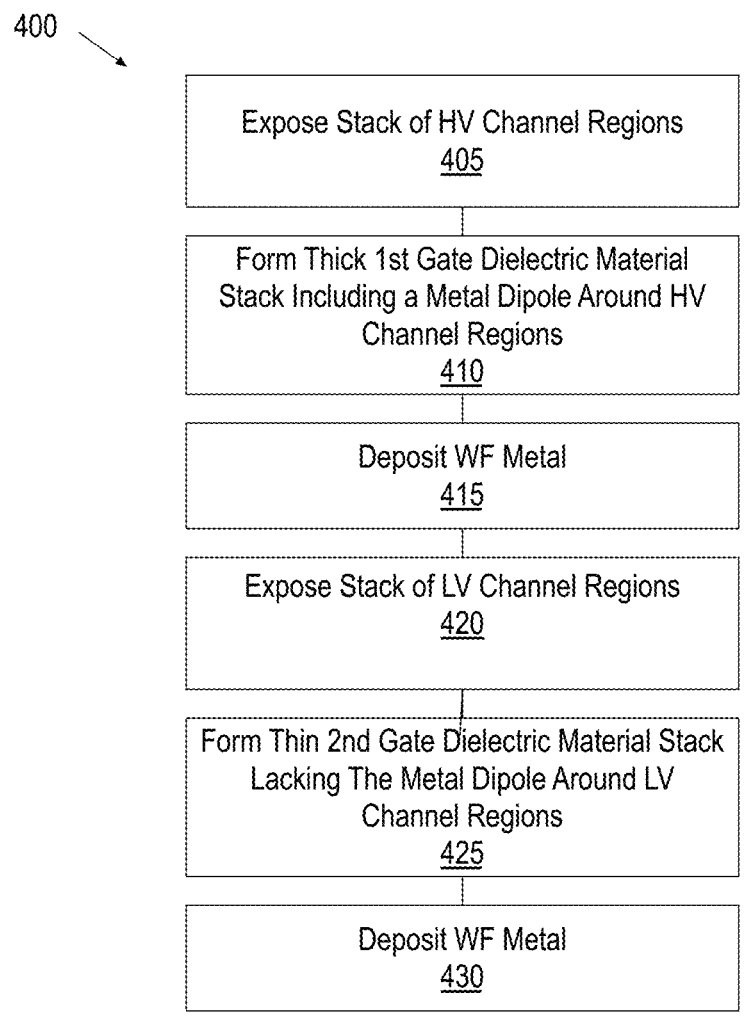
FIG. 4 is a flow diagram illustrating methods of tuning $V_t$ in HV and LV transistor stack structures, in accordance with some embodiments.

FIG. 4 is a flow diagram illustrating methods 400 of tuning $V_t$ in HV transistor and LV transistor stack structures, in accordance with some embodiments. Through the practice of methods 400, transistors within HV transistor stack structures may be set to operate at particular threshold voltages by including a $V_t$ shifting dipole within a gate dielectric material stack. Such HV transistor $V_t$ tuning may be performed independently of LV transistor stack structures, which may lack any $V_t$ shifting dipole, for example. Rather than relying on a modulation of gate electrode work function between HV and LV transistors, methods 400 tune dipole properties of the gate dielectric material(s). While such dipole tuning may be combined with gate electrode work function tuning, in some embodiments HV and LV stacked transistor structures both include the same electrode work function metal with different threshold voltages thus achieved exclusively through dipole tuning methods 400. Methods 400 may be practiced to arrive at HV transistor stack structure 100 and LV transistor stack structure 200 (FIG. 2A), but may also be practiced to form other HV and LV transistor stack structures. Similarly, methods other than methods 400 may be practiced to arrive at HV and LV transistor stack structures 100 and 200.

Methods 400 begin at block 405 where transistor channel regions of vertical stacks of semiconductor material that are to become HV transistor structures are exposed, for example by removing one or more sacrificial channel masking materials selectively to the channel regions. Any number of such vertical stacks may be exposed within an area of a workpiece. The vertical stacks exposed at block 405 may be one subset of the vertical stacks present on a workpiece. Channel regions of another subset of the vertical stacks that are to become LV transistors may remain protected after block 405.

Methods 400 continue at block 410 where a first gate dielectric material stack is formed around the exposed channel regions. In exemplary embodiments, forming the dielectric material stack at block 410 entails forming both a chemical oxide layer and a first metal oxide compound that is suitable as a high-k gate dielectric material layer. In addition to the first metal oxide compound, a second metal oxide compound is formed around the exposed channel regions. The location of the second metal oxide compound may vary within the gate dielectric material stack as a function of how the compound it is introduced. FIGS. 5A, 5B, and 5C are flow diagrams further illustrating methods 501, 502 and 503, respectively, for forming one or more $V_t$ shifting dipoles in HV transistor stack structures, in accordance with some embodiments. Each of methods 501-503 may be practiced at block 410 in methods 400, for example and the location of dipole metal M2 within the gate dielectric material stack may vary as a function of which of methods 501-503 are practiced.

Referring first to FIG. 5A, methods 501 begin at block 550 where a chemical oxide is formed. Block 550 may entail any of thermal oxidation, plasma-assisted oxidation, UV-assisted oxidation, chemical vapor deposition, or thermal atomic layer deposition (ALD) process. Each of these techniques may form the chemical oxide more or less selectively upon surfaces of the channel regions. As one specific example, a thermal ALD process may include a co-reactant phase where an oxygen precursor, such as ozone is introduced. The thermal ALD cycle may also include a deposition phase during which a silicon precursor (e.g., an amino silane) is introduced. One or more such cycles may be performed to form one or more layers of chemical silicon dioxide ($SiO_2$) upon the channel regions.

Depending on the deposition technique practiced at block 550, various trace levels of impurities, such as hydrogen and/or carbon, may be unintentionally introduced into the thermal $SiO_2$ deposition, but the material may be otherwise substantially pure $SiO_2$. For an embodiment where the exposed channel regions are predominantly silicon, the sequential and self-limiting nature of the oxide formation process may ensure the channel material is minimally altered (consumed).

At block 575, any of the high-k dielectric materials described above are formed, for example with a CVD or ALD process. An ALD half-reaction precursor may, for example, include a first metal. A co-reactant half-reaction precursor may, for example, include oxygen. Any number of ALD cycles may be performed at block 575 to reach a desired high-k dielectric material thickness (e.g., 1.0-2.0 nm). Following block 575, a dipole source material is formed at block 585. The dipole source material may be deposited by another CVD or cyclic ALD process. In an ALD process, a deposition half-reaction precursor may comprises a second metal (i.e., the dipole metal M2 ), while the co-reactant half-reaction precursor includes oxygen. Any number of such ALD cycles may be performed at block 585 to reach a desired thickness of dipole source material. In exemplary embodiments, one to five such cycles are performed, for example to deposit 0.5-2.0 nm of dipole source material.

FIG. 5B illustrates alternative embodiments where methods 502 are practiced at block 410 of methods 400 (FIG. 4). Methods 502 include all the blocks of methods 501 and further include block 590 where the dipole species are thermally driven from the dipole source material toward the channel region. In exemplary embodiments, diffusion of the $V_t$ shifting dipole is driven by elevated temperature processing. One or more thermal processes may be performed at block 590 to diffuse the dipole toward the channel regions until it comes to rest, for example, within the chemical oxide layer between the high-k dielectric material layer and the channel material. Block 590 may, for example, include a heat cycle during which the transistor stack structures reach a temperature of over 500° C. (e.g., 700° C., 750° C., 800° C., or 850° C.) for a predetermined time in the presence of any suitable ambient, such as, but not limited to, nitrogen ($N_2$), or forming gas ($N_2$:$H_2$).

FIG. 5C illustrates alternative embodiments where methods 503 are practiced at block 410 of methods 400 (FIG. 4). Methods 503 include all the block of methods 501 but the deposition sequence is modified such that the dipole source material is formed before the high-k material layer. In the illustrated embodiment, the dipole source material is formed at block 585 prior to forming the chemical oxide at block 550. In still other embodiments, the dipole source material is formed after forming the chemical oxide at block 550, but before forming the high-k gate dielectric layer at block 575. Although no thermal anneal is illustrated in FIG. 5C, methods 503 may also end with a dipole diffusion drive, for example substantially as described above for block 590 in methods 502 (FIG. 5B).

Following methods 501, 502 or 503, the HV gate insulator stack is substantially complete and, as a result of the processing described, the dipole metal may be most concentrated within specific regions of the gate insulator stack. For example, the highest concentration of the dipole metal may be between the high-k gate dielectric and a gate electrode (e.g., work function metal) if methods 501 are practiced. In contrast, if either methods 502 or 503 are practiced, the highest concentration of the dipole metal may instead be between the chemical oxide and the channel material, for example substantially as illustrated in FIG. 3A. Similarly, if the dipole source is formed after the chemical oxide layer but before formation of the high-k dielectric material layer, the highest concentration may be between the chemical oxide and the high-k dielectric material, unless a thermal anneal is performed to diffuse most of the dipole metal to the interface of the channel region. For any of the embodiments, a threshold voltage difference between HV and LV transistors may be deduced by detecting the dipole metal through chemical analysis of the gate insulator stacks, for example by STEM-EELS (electron energy-loss spectroscopy)/EDS (energy dispersive x-ray spectroscopy).

Methods 400 (FIG. 4) may continue at block 415 where a work function metal is deposited over the HV gate insulator stack. Any work function metal, such as one of those described above, may be deposited at block 415. In some embodiments, the work function metal is deposited with a cyclic ALD process known to be suitable for the particular work function metal. Notably, if both HV and LV transistors are to utilize the same workfunction metal, block 415 may be skipped. The workfunction metal is then to be subsequently deposited for both HV and LV transistors (e.g., at block 430 as described elsewhere herein).

At block 420, LV channel regions are exposed, for example by removing a channel mask from a subset of stack structures that are to become LV transistors. At block 425 a second, thinner, gate insulator stack is formed. Block 425 may include formation of another chemical oxide layer, for example with any of thermal oxidation, plasma-assisted oxidation, UV-assisted oxidation, chemical vapor deposition, or ALD. Each of these techniques may form the chemical oxide more or less selectively upon surfaces of the channel regions. In exemplary embodiments, the chemical oxide layer formed at block 425 is thinner than the chemical oxide layer formed at block 410. The chemical oxide layer formation process may otherwise be substantially the same as that formed at block 410. In exemplary embodiments, a high-k material layer is also formed at block 425. The high-k material formation process may substantially the same process practiced at block 410 to form substantially the same high-k material layer, albeit at perhaps a different (e.g., lesser) thickness. The deposition process(es) performed at block 425 may therefore be very similar to those performed at block 410. However, in exemplary embodiments, the dipole metal source material formed at block 410 is not formed at block 425.

Methods 400 then complete at block 430 where work function metal is deposited over the LV gate insulator stack. Any work function metal, such as one of those described above may be deposited at block 430. The work function metal may be deposited with any cyclic ALD process known to be suitable for the particular work function metal. In some embodiments, the same work function metal deposited at block 415 is also deposited at block 430, for example with substantially the same ALD process. Any conventional transistor processing may then be continued to fabricate an IC that includes both HV transistor stack structures and LV transistor stack structures.

Figure 6:
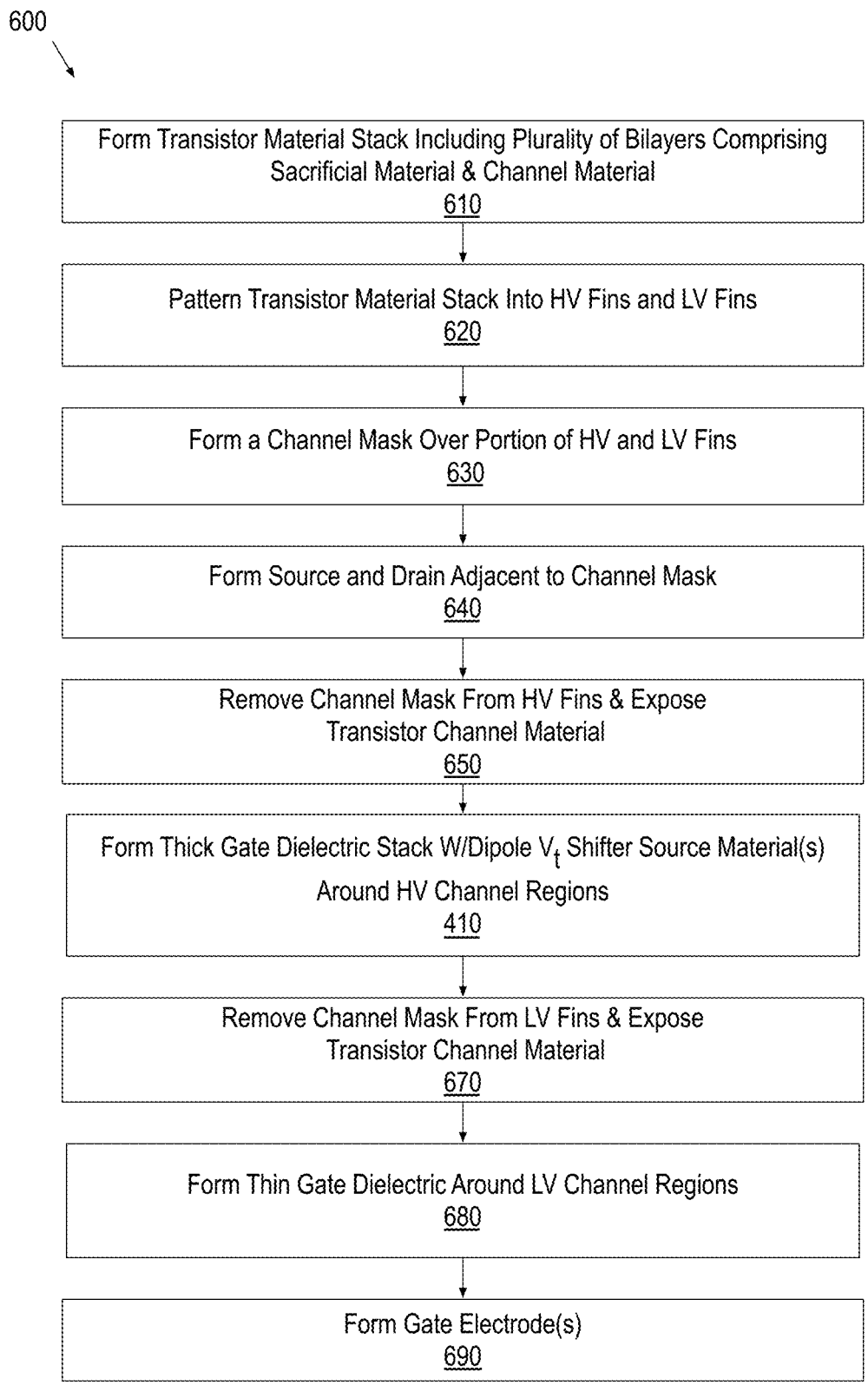
FIG. 6 is a flow diagram illustrating methods of fabricating a LV transistor stack structure with a HV transistor stack structure that includes a $V_t$ shifting dipole, in accordance with some embodiments.

FIG. 6 is a flow diagram illustrating methods 600 further describing the fabrication of a LV transistor stack structure with a HV transistor stack structure that includes a $V_t$ shifting dipole, in accordance with some embodiments. Methods 600 may be practiced in some implementations of methods 400, for example. Methods 600 begin at bock 610 with forming a transistor channel material stack including a plurality of bi-layers comprising a sacrificial material and a channel material over an area of substrate, such as a semiconductor wafer, that is to become in IC chip. In some embodiments, the sacrificial material layers include more germanium than the channel material. For example, where the channel material is predominantly silicon, sacrificial layers are $Si_{1-x}Ge_x$, where X is between 0.15-0.6.

At block 620, the transistor channel material stack is patterned into a plurality of fins, a subset of the fins being HV fins from which a HV transistor will be fabricated and a subset of the fins being LV fins from which a LV transistor will be fabricated. Any patterning process, such as a spacer-based lithographic pitch-reduction patterning process, may be practiced at block 620. Any subtractive etch may be practiced at block 620 to delineate features (e.g., fins) into the channel material stack. In some embodiments, a plasma etch process may be utilized to define features. The patterning process carried out at block 620 may also etch a portion of the underlying substrate (e.g., silicon).

At block 630 a portion of the features patterned at block 620 is protected with a channel mask. The channel mask may include one or more material layers. Prior to forming the channel mask, a dielectric material may be formed over the fins of stacked channel materials, and on sidewalls of the fins. The dielectric may then be planarized so a top surface of the dielectric material is substantially coplanar with a top surface of the fin. The planar dielectric material may be recessed to a level at, or below, one or more of the channel materials in the stack. In some embodiments, the channel mask formed over exposed portions of the fin includes a sacrificial gate stack, for example further including a dielectric layer such as silicon oxide, or $Al_2O_3$, and any other material, such as, but not limited to polysilicon. Optionally, a spacer dielectric may be formed over the channel mask and anisotropically etched to form a spacer around the channel mask.

Methods 600 continue at block 640 where source and drain regions are formed adjacent to the channel mask and/or spacer. Block 640 may include the removal of at sacrificial material layers between the channel materials, and may further include removal of the channel material as well. Following the channel material stack etch(es), source and drain material may be deposited or epitaxially grown in contact with the channel material layers of the fin. In some embodiments, the source and drain structures are epitaxially grown by a low pressure CVD (LPCVD) process. In PMOS embodiments, the source and drain regions grown at block 640 include predominantly silicon or $Si_{1-x}Ge_x$, where X is between 0.2-0.65, and one or more $p^+$ dopants, such as boron, gallium, indium, or aluminum. In NMOS embodiments, source and drain regions grown at block 640 include predominantly silicon, and one or more n-dopants such as phosphorus, arsenic, or antimony. In CMOS embodiments, block 640 may entail iterative removal of sacrificial material layers and source drain material deposition/growth to form both P-type and N-type portions of the source and drain.

Methods 600 continue at block 650 where the channel mask is removed from HV fins and sacrificial material stripped from between channel regions of the exposed stack of channel materials. In some embodiments, the sacrificial layers are selectively removed from intervening channel materials with wet chemical etch process to expose the channel material as ribbon or wires. FIG. 7A-7D illustrate cross-sectional views of HV transistor stack structure 100 and LV transistor stack structure 200 along the B-B' plane (introduced above) evolving as the methods 600 are practiced. In the example illustrated in FIG. 7A, LV transistor stack structure 200 remains protected by a channel mask 710. Accordingly, sacrificial layers 703 remain between channel regions 105. However, channel mask 710 and sacrificial layers 703 have been removed (e.g., etched) to expose channel regions 105 from HV transistor stack structure 100.

Following the exposure of HV transistor channel regions, methods 600 continue with the formation of a HV gate dielectric material stack at block 660, for example substantially as described above. In the example illustrated in FIG.

7B, LV transistor stack structure 200 remains protected by a channel mask 710 while thermal oxide layer 310 is formed on channel regions 105 of HV transistor stack structure 100. A metal dipole source material 711 is then formed on thermal oxide layer 310, which may then be driven into thermal oxide layer 310 with a thermal anneal.

During a thermal drive-in of the $V_t$ shifting dipole, source material 711 may diffuse (before or after formation of a high-k dielectric material layer) so that no compositionally distinct layer of source material 711 remains. Alternatively, source material 711 may be stripped as sacrificial following an anneal process. However, source material 711 may also remain as a compositionally distinct permanent layer of the gate insulator stack if its retention poses no issue for subsequent fabrication (e.g., gate electrode formation) and/or transistor operation. The HV gate insulator stack may be completed with the formation of the high-k gate dielectric layer.

Figure 7A:
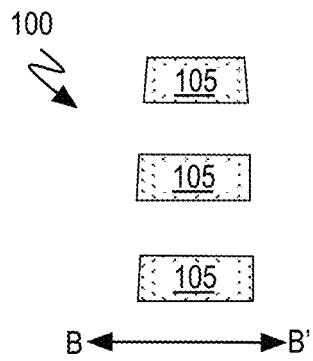
FIGS. 7A, 7B, 7C, and 7D illustrate cross-sectional views of a HV transistor stack structure and a LV transistor stack structure evolving as the methods illustrated in FIG. 6 are practiced, in accordance with some embodiments.
Figure 7A:
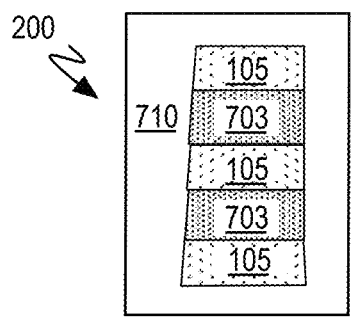
Figure 7B:
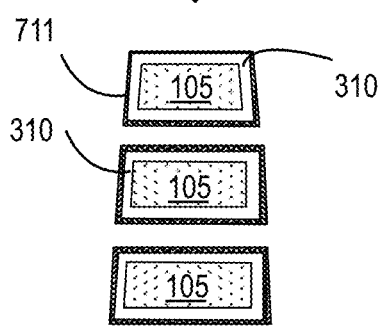
Figure 7B:
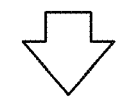
Figure 7B:
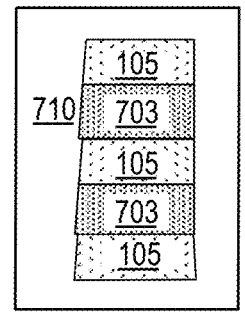
Figure 7C:
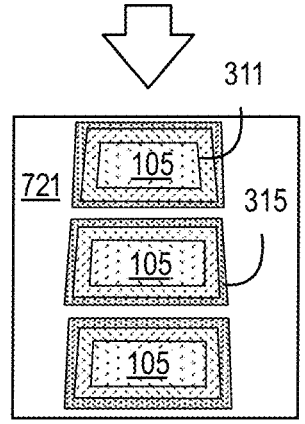
Figure 7C:
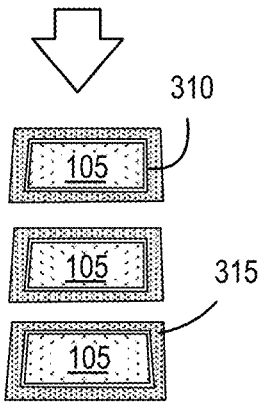

Methods 600 (FIG. 6) continue at block 670 where the channel mask is then removed from LV fins, and sacrificial material between the channel regions is selectively etched. At block 680, the LV gate insulator stack maybe formed. The HV transistor stacks may be masked during execution of blocks 670 and 680, for example to protect the HV gate dielectric. FIG. 7C further illustrates an embodiment where a protective mask material 721, such as diamond-like carbon (DLC), protects the thick HV gate insulator stack. As shown, the thick gate insulator stack now further includes a high-k material layer 315 cladding the thermal oxide layer 311, which now comprises the dipole metal M2. As further illustrated, channel mask 710 and sacrificial material 703 have been removed from around channel regions 105, and replaced with a thin gate insulator stack that includes chemical oxide layer 310 and high-k material layer 315.

Figure 7D:
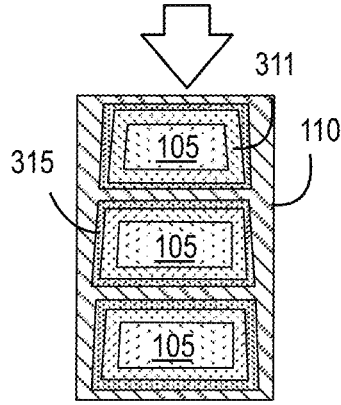
Figure 7D:
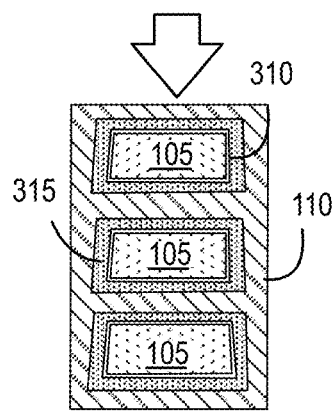

Methods 600 (FIG. 6) then complete at block 690 where one or more gate electrodes are formed around the gate insulator stacks. If the gate electrodes are to be different between HV and LV transistor stacks, mask material over one the HV or LV gate insulator stacks may be retained during deposition of a first gate electrode. A second gate electrode may then be deposited after removing the mask material. Gate electrode formation may include the deposition of only one, or more than one, work function metal. Gate electrode formation may further include deposition of fill metal, such as, but not limited to, W. Deposition of the fill metal may be by ALD or CVD, for example. Gate electrode formation may further include deposition of a diffusion barrier (e.g., TiN, MoN, WN, TaN, or NbN) between the work function metal and at least one of the gate insulator stack and the fill metal (i.e., on either side of the work function metal). FIG. 7D illustrates HV and LV transistor stack structures 100 and 200 that again include same gate electrode 110. At this point, the HV and LV transistor stack structures 100 and 200 are substantially complete and may be interconnected with other HV and/or LV transistor stack structures through one or more levels of interconnect metallization according to any backend of line (BEOL) fabrication processes known to be suitable for integrated circuits (ICs).

Figure 8:
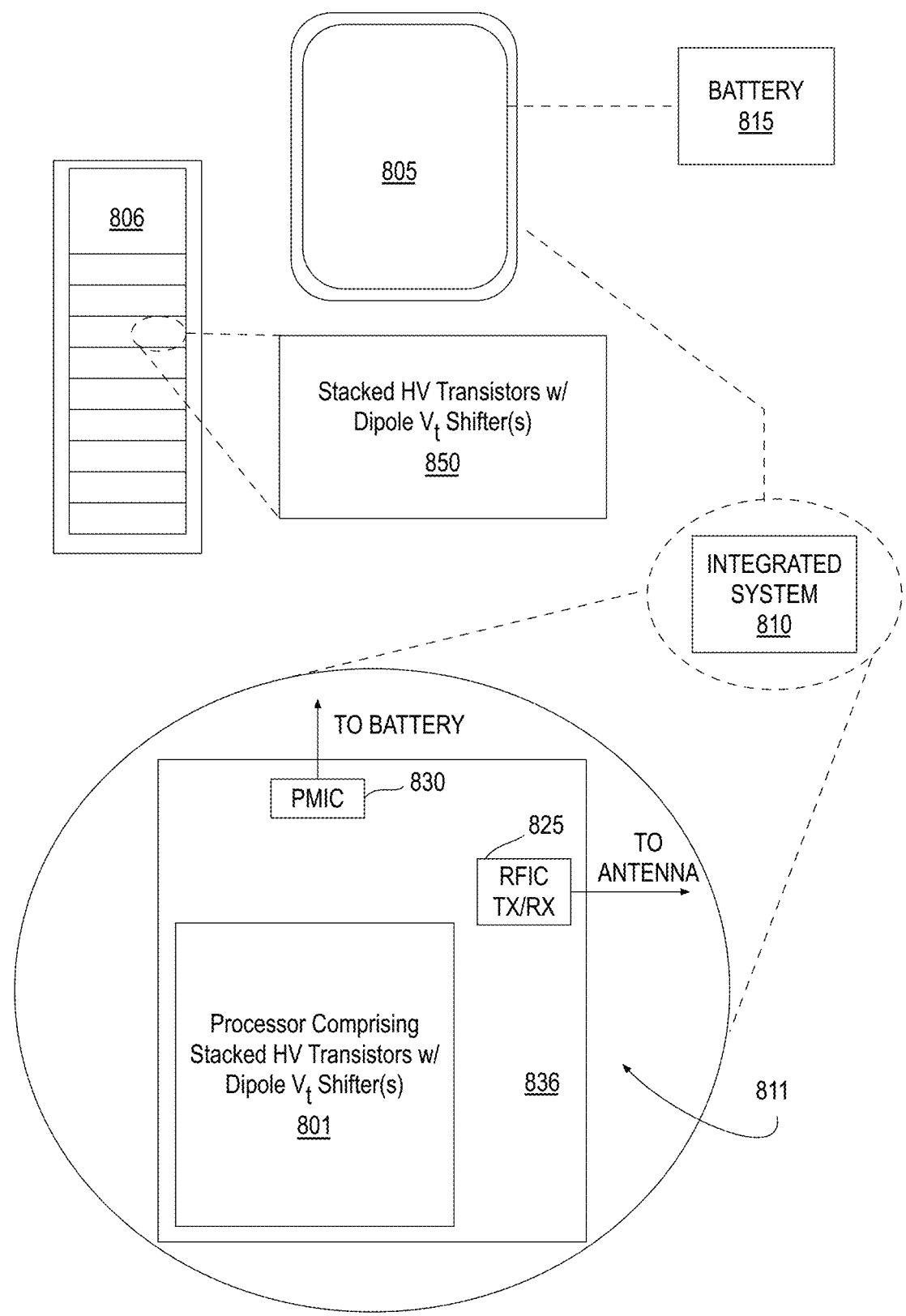
FIG. 8 illustrates a mobile computing platform and a data server machine employing an IC including HV transistor stack structures with a $V_t$ shifting dipole, in accordance with embodiments.

The HV and/or LV transistor stack structures with a threshold voltage shifting dipole, and the methods of forming such structures described herein may be integrated into a wide variety of ICs and computing systems that include such ICs. FIG. 8 illustrates a system in which a mobile computing platform 805 and/or a data server machine 806 employs an IC having a memory and/or microprocessor IC with one or more HV transistor stack structures including a $V_t$ shifting dipole within the gate insulator stack, for example in accordance with some embodiments described elsewhere herein. In some embodiments, the HV transistor stack is coupled to an I/O of the memory and/or microprocessor IC. The server machine 806 may be any commercial server, for example including any number of high-performance computing platforms within a rack and networked together for electronic data processing, which in the exemplary embodiment includes a monolithic IC 850. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level integrated system 810, and a battery 815.

Whether disposed within the integrated system 810 illustrated in the expanded view 811, or as a stand-alone packaged chip within the server machine 806, IC 850 may include memory circuitry (e.g., RAM), and/or a logic circuitry (e.g., a microprocessor, a multi-core microprocessor, graphics processor, or the like). At least one of these circuitries further includes one or more HV transistor stack structures including a $V_t$ shifting dipole within the gate insulator stack, for example in accordance with some embodiments described elsewhere herein. IC 850 may be further coupled to a board or package substrate 836 that further hosts one or more additional ICs, such as power management IC 830 and radio frequency IC 825. RFIC 825 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
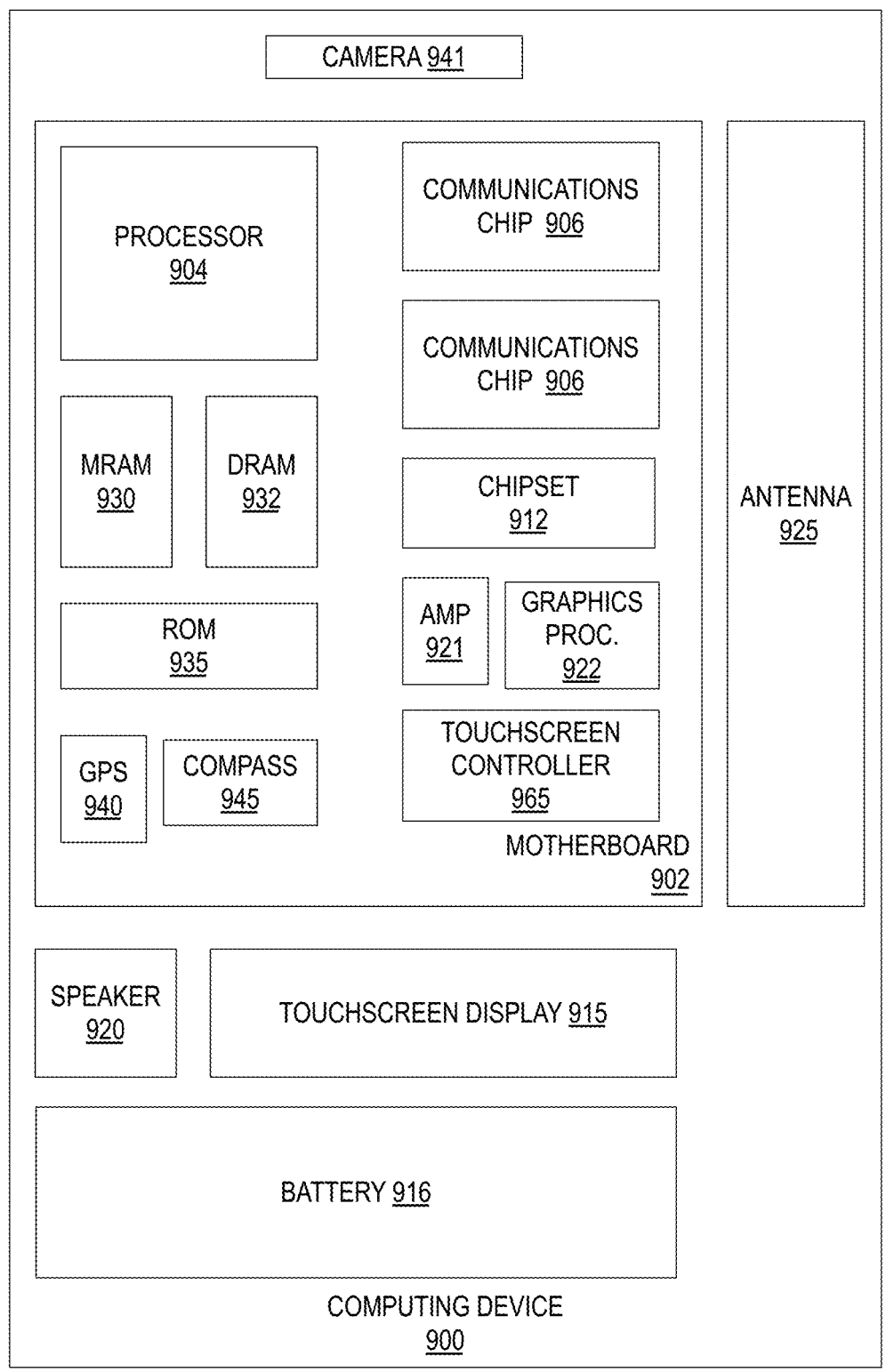
FIG. 9 is a functional block diagram of an electronic computing device, in accordance with some embodiments.

FIG. 9 is a functional block diagram of an electronic computing device 900, in accordance with some embodiments. Device 900 further includes a motherboard 902 hosting a number of components, such as, but not limited to, a processor 904 (e.g., an applications processor). Processor 904 may be physically and/or electrically coupled to motherboard 902. In some examples, processor 904 is part of an IC including one or more HV transistor stack structures including a $V_t$ shifting dipole within the gate insulator stack, for example in accordance with some embodiments described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM 932), non-volatile memory (e.g., ROM 935), flash memory (e.g., NAND or NOR), magnetic memory (MRAM 930), a graphics processor 922, a digital signal processor, a crypto processor, a chipset 912, an antenna 925, touchscreen display 915, touchscreen controller 965, battery 916, audio codec, video codec, power amplifier 921, global positioning system (GPS) device 940, compass 945, accelerometer, gyroscope, speaker 920, camera 941, and mass storage device (such as hard disk drive, solid-state drive (SSD), compact disk (CD), digital versatile disk (DVD), and so forth, or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including, but not limited to, those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC), comprises a first transistor a second transistor laterally adjacent to the first transistor. The first transistor comprises a stack of first channel regions comprising at least one of Si or Ge, a first gate electrode around the first channel regions, and a first gate insulator stack between the first gate electrode and the first channel regions. The first gate insulator stack has a first thickness and includes a high-k gate material layer comprising oxygen and a first metal. The second transistor comprises a stack of second channel regions comprising the at least one of Si or Ge, a second gate channel regions, and a second gate insulator stack between the second gate electrode and the second channel regions. The second gate insulator stack has a second thickness, greater than the first thickness, and includes the high-k gate material layer as well as a $V_t$ shifting dipole material comprising oxygen and a second metal.

In second examples, for any of the first examples the $V_t$ shifting dipole material is absent from the first gate dielectric material stack.

In third examples, for any of the first through second examples both of the first and second gate insulator stacks include a thermal oxide layer in contact with the first and second channel regions, the thermal oxide layer comprising oxygen and the at least one of Si or Ge. A thickness of the thermal oxide layer between the high-k material layer and the first channel regions is less than the thickness of the thermal oxide layer between the high-k material layer and the second channel regions.

In fourth examples, for any of the first through third examples the thermal oxide layer of the second gate insulator stack further comprises the $V_t$ shifting dipole material.

In fifth examples, for any of the fourth examples the high-k material layer is a first high-k material layer, the first gate insulator stack consists of the thermal oxide layer and the first high-k material layer, and the second gate insulator stack includes a second high-k material layer that further comprises the Vt shifting dipole material.

In sixth examples, for any of the fifth examples the second high-k material layer is between the first high-k material layer and the second gate electrode.

In seventh examples, for any of the sixth examples the second high-k material layer is between the first high-k material layer and the thermal oxide layer.

In eighth examples, for any of the first through seventh examples the first gate electrode comprises a work function metal in contact with a top layer of the first gate insulator stack, the second gate electrode comprises the work function metal in contact with a top layer of the second gate insulator stack.

In ninth examples, for any of the first through eighth examples individual ones of the first channel region are spaced apart from each other by a first spacing, individual ones of the second channel regions are spaced apart from each other by the first spacing, and a thickness of the first gate electrode within the first spacing is greater than a thickness of the second gate electrode with the first spacing.

In tenth examples, for any of the first through ninth examples the first metal is a first of Hf, Al, Zr, or Y, and wherein the second metal is Mg, Ca, Sr, La, Sc, Ba, Gd, Er, Yb, Lu, Ga, Mo, Co, Ni, Nb, or a second of Hf, Al, Zr, or Y.

In eleventh examples, for any of the first through tenth examples the first channel regions and the second channel regions have substantially the same composition, the first transistor has a first threshold voltage, and the second transistor has a second threshold voltage, different than the first threshold voltage.

In twelfth examples, for any the first through eleventh examples the first transistor further comprises a first source material coupled to a first drain material through at least one of the first channel regions. The first source material and the first drain material are of a first conductivity type. The second transistor further comprises a second source material coupled to a second drain material through at least one of the second channel regions, wherein the second source material and the second drain material are of the first conductivity type.

In thirteenth examples, for any of the twelfth examples the first conductivity type is P-type the second metal is Al, Ga, Mo, Co, Ni, or Nb, or the first conductivity type is N-type second metal is Mg, Ca, Sr, Ba, La, Sc, Y, Gd, Er, Yb, or Lu.

In fourteenth examples, a computer system, comprises a power supply, and an IC die coupled to the power supply. The IC die comprises a first transistor and a second transistor laterally adjacent to the first transistor. The first transistor comprises a stack of first channel regions comprising at least one of Si or Ge, a first gate electrode around the first channel regions, and a first gate insulator stack between the first gate electrode and the first channel regions. The first gate insulator stack has a first thickness and includes a high-k material layer comprising oxygen and a first metal. The second transistor comprises a stack of second channel regions comprising the at least one of Si or Ge, a second gate electrode around the second channel regions, and a second gate insulator stack between the second gate electrode and the second channel regions. The second gate insulator stack has a second thickness, greater than the first thickness, and includes the high-k material layer as well as a layer comprising oxygen and a second metal that is absent from the first gate insulator stack.

In fifteenth examples, for any of the fourteenth examples the first metal is a first of Hf, Al, Zr, or Y, and the second metal is Mg, Ca, Sr, La, Sc, Ba, Gd, Er, Yb, Lu, Ga, Mo, Co, Ni, Nb, or a second of Hf, Al, Zr, or Y.

In sixteenth examples, for any of the fourteenth through fifteenth examples the system comprises a battery coupled to the power supply.

In seventeenth examples, a method of fabricating an IC comprises exposing a stack of first channel regions over a first region of a substrate. The first channel regions comprise at least one of Si or Ge. The method comprises forming a first gate insulator stack around the first channel regions. The first gate insulator stack has a first thickness, and the forming further comprises forming a thermal oxide layer comprising oxygen and the at least one of Si or Ge, and forming a high-k material layer over the thermal oxide layer, the high-k material layer comprising oxygen and a first metal. The method comprises exposing a stack of second channel regions over a second region of the substrate, the second channel regions comprising the at least one of Si or Ge, and forming a second gate insulator stack around the second channel regions. The second gate insulator stack has a second thickness, greater than the first thickness, and the forming further comprises forming the thermal oxide layer, forming the high-k material layer over the thermal oxide layer, and forming a $V_t$ shifting material layer comprising oxygen and a second metal within the second gate insulator stack.

In eighteenth examples, for any of the seventeenth examples the method further comprises diffusing the second metal from the $V_t$ shifting material, toward the second channel regions. The diffusing further comprises performing a thermal anneal at a temperature of at least 700° C.

In nineteenth examples, for any of the eighteenth examples forming the $V_t$ shifting material layer further comprises depositing the $V_t$ shifting material layer after forming the thermal oxide layer.

In twentieth examples forming the $V_t$ shifting material layer comprises depositing the $V_t$ shifting material layer in contact with the thermal oxide layer, and forming the high-k material layer comprises depositing the high-k material layer in contact with the $V_t$ shifting material layer.

In twenty-first examples forming the high-k material layer comprises depositing the high-k material layer in contact with the thermal oxide layer, and forming the $V_t$ shifting material layer comprises depositing the $V_t$ shifting material layer in contact with the high-k material layer.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC), comprising:
    a first transistor, comprising:
        a stack of first channel regions comprising at least one of Si or Ge;
        a first gate electrode around the first channel regions; and
        a first gate insulator stack between the first gate electrode and the first channel regions, wherein the first gate insulator stack comprises:
            a first insulator layer comprising oxygen and the at least one of Si or Ge, the first insulator layer in direct contact with the first channel regions and having a first thickness; and
            a second insulator layer comprising oxygen and a first metal, the second insulator layer in direct contact with both the first insulator layer and the first gate electrode, wherein the first metal is a first of Hf, Al, Zr, or Y; and
    a second transistor, comprising:
        a stack of second channel regions comprising the at least one of Si or Ge;
        a second gate electrode around the second channel regions; and
        a second gate insulator stack between the second gate electrode and the second channel regions, wherein the second gate insulator stack comprises:
            a third insulator layer comprising oxygen and the at least one of Si or Ge, the third insulator layer in direct contact with the second channel regions, and having a second thickness, greater than the first thickness; and
            a fourth insulator layer comprising oxygen and the first metal, the fourth insulator layer between the third insulator layer and the second gate electrode, wherein the second gate insulator stack further comprises a second metal absent from the first gate insulator stack, and wherein the second metal is Mg, Ca, Sr, La, Sc, Ba, Gd, Er, Yb, Lu, Ga, Mo, Co, Ni, Nb, or a second of Hf, Al, Zr, or Y.

2. The IC of claim 1, wherein the third insulator layer further comprises the second metal.

3. The IC of claim 1, wherein the second gate insulator stack includes a fifth insulator layer that further comprises the second metal.

4. The IC of claim 3, wherein the fifth insulator layer is between the fourth insulator layer and the second gate electrode.

5. The IC of claim 3, wherein the fifth insulator layer is between the fourth insulator layer and the third insulator layer.

6. The IC of claim 1, wherein:
    the first gate electrode comprises a work function metal in contact with a top layer of the first gate insulator stack; and
    the second gate electrode comprises the same work function metal in contact with a top layer of the second gate insulator stack.

7. The IC of claim 1, wherein:
    the first channel regions and the second channel regions have substantially the same composition;
    the first transistor has a first threshold voltage; and
    the second transistor has a second threshold voltage, different than the first threshold voltage.

8. The IC of claim 1, wherein:
the first transistor further comprises a first source material coupled to a first drain material through at least one of the first channel regions, wherein the first source material and the first drain material are of a first conductivity type; and
the second transistor further comprises a second source material coupled to a second drain material through at least one of the second channel regions, wherein the second source material and the second drain material are of the first conductivity type.

9. The IC of claim 8, wherein:
the first conductivity type is P-type the second metal is Al, Ga, Mo, Co, Ni, or Nb; or
the first conductivity type is N-type second metal is Mg, Ca, Sr, Ba, La, Sc, Y, Gd, Er, Yb, or Lu.

10. A computer system, comprising:
a power supply; and
the IC of claim 1 coupled to the power supply.

11. The computer system of claim 10, wherein the first metal is a first of Hf, Al, Zr, or Y, and wherein the second metal is Mg, Ca, Sr, La, Sc, Ba, Gd, Er, Yb, Lu, Ga, Mo, Co, Ni, Nb, or a second of Hf, Al, Zr, or Y.

12. The computer system of claim 10, further comprising a battery coupled to the power supply.

13. An integrated circuit (IC), comprising:
a first transistor, comprising:
    a stack of first channel regions comprising at least one of Si or Ge;
    a first gate electrode around the first channel regions; and
    a first gate insulator stack between the first gate electrode and the first channel regions, wherein the first gate insulator stack comprises:
        a first insulator layer comprising oxygen and the at least one of Si or Ge, the first insulator layer in direct contact with the first channel regions and having a first thickness; and
        a second insulator layer comprising oxygen and a first metal, the second insulator layer in direct contact with both the first insulator layer and the first gate electrode; and
a second transistor, comprising:
    a stack of second channel regions comprising the at least one of Si or Ge;
    a second gate electrode around the second channel regions; and
    a second gate insulator stack between the second gate electrode and the second channel regions, wherein the second gate insulator stack comprises:
    a third insulator layer comprising oxygen and the at least one of Si or Ge, the third insulator layer in direct contact with the second channel regions, and having a second thickness, greater than the first thickness; and
    a fourth insulator layer comprising oxygen and the first metal, the fourth insulator layer between the third insulator layer and the second gate electrode, wherein the second gate insulator stack further comprises a second metal absent from the first gate insulator stack,
wherein:
    individual ones of the first channel region are spaced apart from each other by a first spacing;
    individual ones of the second channel regions are spaced apart from each other by the first spacing; and
    a thickness of the first gate electrode within the first spacing is greater than a thickness of the second gate electrode with the first spacing.

14. The IC of claim 13, wherein the first metal is a first of Hf, Al, Zr, or Y, and wherein the second metal is Mg, Ca, Sr, La, Sc, Ba, Gd, Er, Yb, Lu, Ga, Mo, Co, Ni, Nb, or a second of Hf, Al, Zr, or Y.

15. An apparatus, comprising:
a low voltage transistor, comprising:
    a stack of first channel regions comprising at least one of Si or Ge;
    a first gate electrode around the first channel regions; and
    a first gate insulator stack between the first gate electrode and the first channel regions, wherein the first gate insulator stack comprises:
        a first insulator layer comprising oxygen and the at least one of Si or Ge, the first insulator layer in direct contact with the first channel regions and having a first thickness; and
        a second insulator layer comprising oxygen and a first metal, the second insulator layer in direct contact with both the first insulator layer and the first gate electrode; and
a high voltage transistor, comprising:
    a stack of second channel regions comprising the at least one of Si or Ge;
    a second gate electrode around the second channel regions; and
    a second gate insulator stack between the second gate electrode and the second channel regions, wherein the second gate insulator stack comprises:
        a third insulator layer comprising oxygen and the at least one of Si or Ge, the third insulator layer in direct contact with the second channel regions, and having a second thickness, greater than the first thickness; and
        a fourth insulator layer comprising oxygen and the first metal, the fourth insulator layer between the third insulator layer and the second gate electrode, wherein the second gate insulator stack further comprises a second metal absent from the first gate insulator stack.

16. The apparatus of claim 15, wherein the first metal is a first of Hf, Al, Zr, or Y, and wherein the second metal is Mg, Ca, Sr, La, Sc, Ba, Gd, Er, Yb, Lu, Ga, Mo, Co, Ni, Nb, or a second of Hf, Al, Zr, or Y.

17. The apparatus of claim 16, wherein the second metal is within a fifth insulator layer between the fourth insulator layer and the second gate electrode.

18. The apparatus of claim 16, wherein the second metal is within a fifth insulator layer between the fourth insulator layer and the third insulator layer.

19. The apparatus of claim 16, wherein the second metal is at an interface of the third insulator layer and the second channel regions.

20. An integrated circuit (IC), comprising:
a first transistor, comprising:
    a stack of first channel regions comprising at least one of Si or Ge;
    a first gate electrode around the first channel regions; and
    a first gate insulator stack between the first gate electrode and the first channel regions, wherein the first gate insulator stack comprises:
        a first insulator layer comprising oxygen and the at least one of Si or Ge, the first insulator layer in direct contact with the first channel regions and having a first thickness; and
a second insulator layer comprising oxygen and a first metal, the second insulator layer in direct contact with both the first insulator layer and the first gate electrode; and
a second transistor, comprising:
a stack of second channel regions comprising the at least one of Si or Ge;
a second gate electrode around the second channel regions; and
a second gate insulator stack between the second gate electrode and the second channel regions, wherein the second gate insulator stack comprises:
a third insulator layer comprising oxygen and the at least one of Si or Ge, the third insulator layer in direct contact with the second channel regions, and having a second thickness, greater than the first thickness; and
a fourth insulator layer comprising oxygen and the first metal, the fourth insulator layer between the third insulator layer and the second gate electrode, wherein the second gate insulator stack further comprises a second metal absent from the first gate insulator stack, and wherein the second metal is at an interface of the third insulator layer and the second channel regions.

* * * * *